(12) United States Patent
Otremba et al.

(10) Patent No.: US 9,263,440 B2
(45) Date of Patent: Feb. 16, 2016

(54) POWER TRANSISTOR ARRANGEMENT AND PACKAGE HAVING THE SAME

(71) Applicant: Infineon Technologies Austria AG, Villach (AT)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 82 days.

(21) Appl. No.: 13/763,769

(22) Filed: Feb. 11, 2013

(65) Prior Publication Data

US 2014/0225124 A1     Aug. 14, 2014

(51) Int. Cl.
| | | |
|---|---|---|
| *H01L 23/495* | (2006.01) | |
| *H01L 27/088* | (2006.01) | |
| *H01L 23/498* | (2006.01) | |
| *H01L 23/00* | (2006.01) | |
| *H01L 25/07* | (2006.01) | |

(52) U.S. Cl.
CPC ........ *H01L 27/088* (2013.01); *H01L 23/49524* (2013.01); *H01L 23/49562* (2013.01); *H01L 23/49575* (2013.01); *H01L 23/49844* (2013.01); *H01L 24/34* (2013.01); *H01L 25/071* (2013.01); *H01L 25/072* (2013.01); *H01L 2224/48091* (2013.01); *H01L 2224/48247* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01)

(58) Field of Classification Search
CPC ................... H01L 23/49575; H01L 23/49562; H01L 23/49844; H01L 25/072; H01L 25/071
See application file for complete search history.

(56) References Cited

U.S. PATENT DOCUMENTS

| 6,157,049 A | 12/2000 | Mitlehner et al. |
| 8,227,908 B2 | 7/2012 | Otremba et al. |

(Continued)

FOREIGN PATENT DOCUMENTS

| DE | 19610135 C1 | 6/1997 |
| DE | 102005034012 A1 | 11/2006 |

OTHER PUBLICATIONS

Abstract of DE102005034012A1; Nov. 9, 2006.

*Primary Examiner* — Yu Chen
(74) *Attorney, Agent, or Firm* — Viering, Jentschura & Partner MBB

(57) ABSTRACT

Various embodiments provide a power transistor arrangement, which may include a carrier including at least a main region, a first terminal region and a second terminal region being electrically isolated from each other; a first power transistor having a control electrode, a first power electrode and a second power electrode, and being arranged on the main region of the carrier such that its first power electrode is facing towards and is electrically coupled to the main region of the carrier; a second power transistor having a control electrode, a first power electrode and a second power electrode, and being arranged on the terminal regions of the carrier such that its control electrode and its first power electrode are facing towards the terminal regions, and having its control electrode being electrically coupled to the first terminal region and its first power electrode being electrically coupled to the second terminal region.

18 Claims, 7 Drawing Sheets

(56) References Cited

U.S. PATENT DOCUMENTS

| | | | |
|---|---|---|---|
| 2004/0061221 A1* | 4/2004 | Schaffer | 257/723 |
| 2008/0224300 A1* | 9/2008 | Otremba | 257/693 |
| 2008/0224323 A1* | 9/2008 | Otremba | 257/778 |
| 2009/0189291 A1* | 7/2009 | Landau et al. | 257/777 |
| 2011/0049690 A1* | 3/2011 | Cho | 257/676 |
| 2011/0298533 A1* | 12/2011 | Imayama | 327/566 |
| 2012/0068186 A1 | 3/2012 | Otremba | |

* cited by examiner

POWER TRANSISTOR ARRANGEMENT AND PACKAGE HAVING THE SAME

TECHNICAL FIELD

Various embodiments relate generally to a power transistor arrangement and a package having the same.

BACKGROUND

Power semiconductor chips may be integrated into an electronic package for various circuitry. For example, a cascade circuit or a half bridge circuit can be implemented by discrete components or packages, or by means of a chip-on-chip structure, in which diffusion soldering may be used.

Discrete components or packages may result in a significant package inductivity and thus switching losses. A chip-on-chip structure may result in thermal limitations with respect to the chip on the top (e.g. a silicon field effect transistor chip).

SUMMARY

Various embodiments provide a power transistor arrangement. The power transistor arrangement may include a carrier including at least a main region and a first terminal region and a second terminal region, the main region, the first terminal region and the second terminal region being electrically isolated from each other; a first power transistor having a control electrode and a first power electrode and a second power electrode, the first power transistor being arranged on the main region of the carrier such that the first power electrode of the first power transistor is facing towards the main region of the carrier and is electrically coupled to the main region of the carrier; a second power transistor having a control electrode and a first power electrode and a second power electrode, the second power transistor being arranged on the first terminal region and the second terminal region such that the control electrode of the second power transistor and the first power electrode of the second power transistor are facing towards the terminal regions of the carrier. The control electrode of the second power transistor may be electrically coupled to the first terminal region of the carrier, and the first power electrode of the second power transistor may be electrically coupled to the second terminal region of the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a low-inductive package for power applications.

FIGS. 1 to 4 show a power transistor arrangement 100 according to various embodiments.

Figure 1:
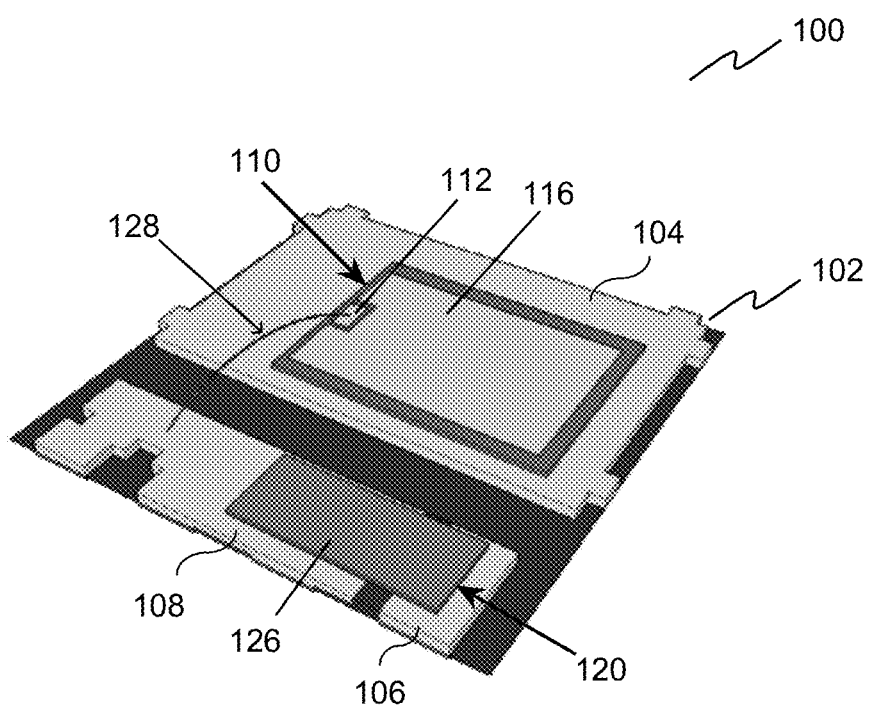
FIG. 1 shows a power transistor arrangement according to various embodiments.
Figure 2:
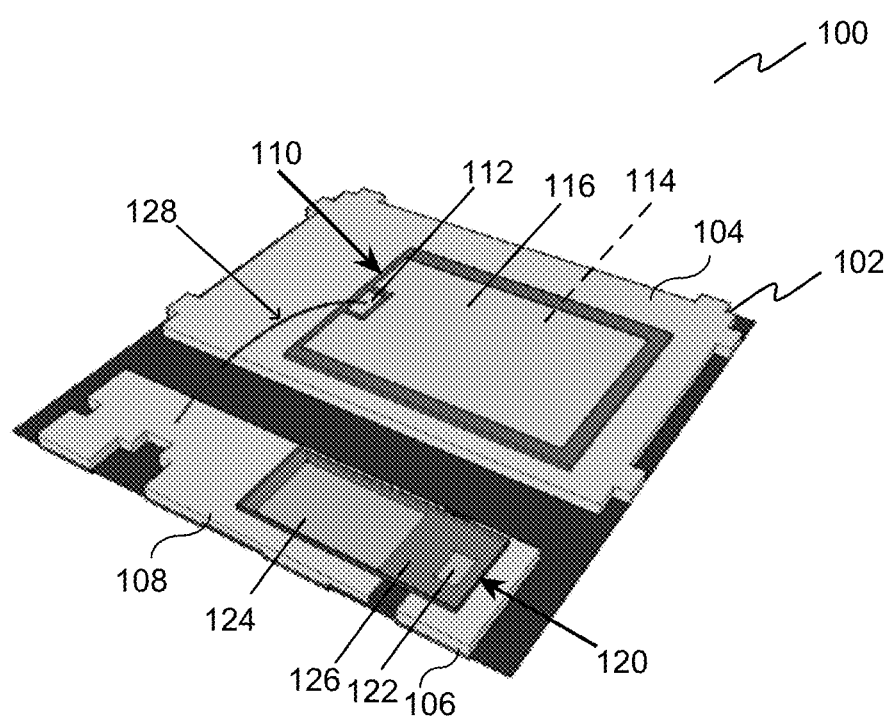
FIG. 2 shows a power transistor arrangement according to various embodiments.

FIG. 1 shows a top view of the power transistor arrangement 100, and FIG. 2 shows a perspective view in which part of the backside of the power transistor arrangement 100 is shown.

The power transistor arrangement 100 may include a carrier 102, a first power transistor 110, and a second power transistor 120. The carrier 102 may include at least a main region 104, a first terminal region 106 and a second terminal region 108. The main region 104, the first terminal region 106 and the second terminal region 108 may be electrically isolated from each other.

As shown in FIG. 1 and FIG. 2, the first power transistor 110 may include a control electrode 112, a first power electrode 114 and a second power electrode 116. In various embodiments, the first power transistor 110 may be arranged on the main region 104 of the carrier 102 such that the first power electrode 114 of the first power transistor 110 is facing towards the main region 104 of the carrier 102 and is electrically coupled to the main region 104 of the carrier 102. For example, the first power electrode 114 of the first power transistor 110 is at the backside of the first power transistor 110 in FIG. 1 and FIG. 2.

In various embodiments, the first power transistor 110 may be arranged on the main region 104 of the carrier 102 such that the control electrode 112 of the first power transistor 110 is facing away from the main region 104 of the carrier 102.

As shown in FIG. 1 and FIG. 2, the second power transistor 120 may include a control electrode 122, a first power electrode 124 and a second power electrode 126. The second power transistor 120 may be arranged on the first terminal region 106 and the second terminal region 108 such that the control electrode 122 of the second power transistor 120 and the first power electrode 124 of the second power transistor 120 are facing towards the terminal regions 106, 108 of the carrier 102. In FIG. 2, the second power transistor 120 is shown in a perspective view so that the control electrode 122 and the first power electrode 124 at the backside of the second power transistor 120 facing the carrier 102 can be seen. The control electrode 122 of the second power transistor 120 may be electrically coupled to the first terminal region 106 of the carrier 102, and the first power electrode 124 of the second power transistor 120 may be electrically coupled to the second terminal region 108 of the carrier 102.

The carrier 102 may be a leadframe structure, which may be made of a metal or a metal alloy, e.g. a material selected from a group consisting of: copper (Cu), iron nickel (FeNi), steel, and the like. In various embodiment, the main region 104 may be a leadframe. The first terminal region 106 may be a first lead of the leadframe structure. The second terminal region 108 may be a second lead of the leadframe structure.

The main region 104 of the carrier 102 may have a size of at least 10 mm$^2$. In various embodiments, the main region 104 of the carrier 102 may have a size of less than or equal to 300 mm$^2$.

In various embodiments, at least one of the first terminal region 106 and the second terminal region 108 of the carrier 102 may have a size of less than or equal to 10 mm$^2$, e.g. less than or equal to 5 mm$^2$, e.g. less than or equal to 2 mm$^2$, e.g. less than or equal to 1 mm$^2$.

In various embodiments, the control electrode 112 of the first power transistor 110 may be electrically coupled to one of the first terminal region 106 and the second terminal region 108. In an embodiment as shown in FIG. 1 and FIG. 2, the control electrode 112 may be electrically coupled to the second terminal region 108 by means of a wire 128, or other suitable types of electrically coupling structure.

Figure 3:
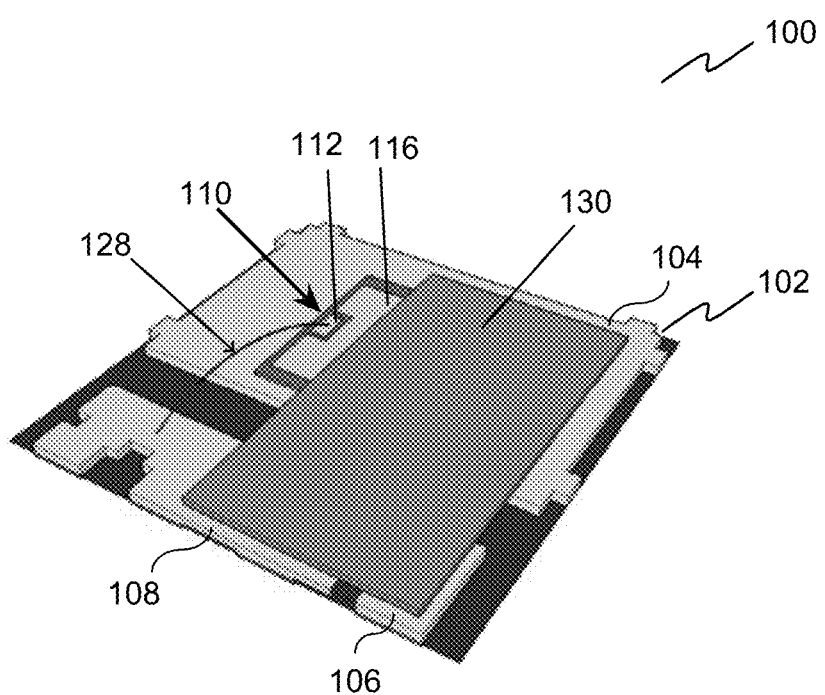
FIG. 3 shows a power transistor arrangement according to various embodiments.
Figure 4:
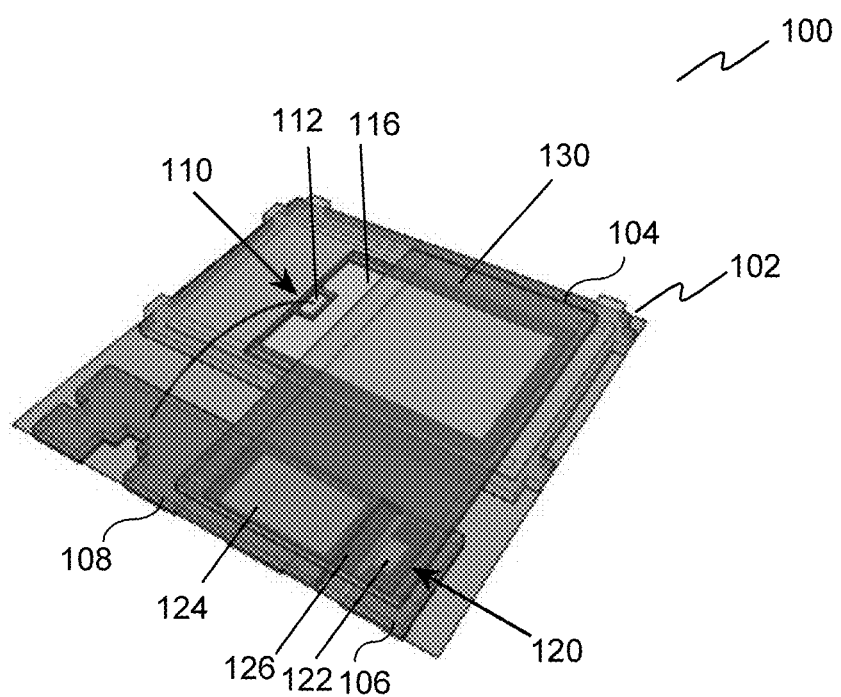
FIG. 4 shows a power transistor arrangement according to various embodiments.

In various embodiments, the second power electrode 116 of the first power transistor 110 and the second power electrode 126 of the second power transistor 120 may be electrically (conductively) coupled with each other. In various embodiments as shown in FIG. 3 and FIG. 4, the second power electrode 116 of the first power transistor 110 and the second power electrode 126 of the second power transistor 120 may be electrically coupled with each other by means of an electrically conductive coupling structure 130. The electrically conductive coupling structure 130 may be arranged above the structure shown in FIG. 1 and FIG. 2, i.e., above the second power electrode 116 of the first power transistor 110 and the second power electrode 126 of the second power transistor 120. FIG. 3 shows the top view of the power transistor arrangement 100 in which the second power transistor 120 and its electrodes 122, 124, 126 are hidden under the electrically conductive coupling structure 130, whereas FIG. 4 shows the perspective view of the power transistor arrangement 100 in which the second power transistor 120 and its electrodes 122, 124, 126 can be seen.

In various embodiments, the coupling structure 130 may include at least one of a metal and a metal alloy, such as e.g. including or consisting of Cu and/or a Cu alloy, and the like. In various embodiments, the coupling structure 130 may include at least one structure selected from a group of structures consisting of: a clip, a ribbon, a wire, a plate, and a conductor track. In various embodiments, the coupling structure 130 may have a thermal resistance of 10 K/W or less, e.g. a thermal resistance of 8 K/W or less, e.g. a thermal resistance of 6 K/W or less, e.g. a thermal resistance of 5 K/W or less, e.g. a thermal resistance of 3 K/W or less, e.g. a thermal resistance of 2 K/W or less, e.g. a thermal resistance of 1 K/W or less.

The electrically conductive coupling structure 130 may be electrically isolated from any power transistor arrangement external terminals. The power transistor arrangement external terminals may include leads or pins coupled to the carrier 102, for example.

In accordance with various embodiments, one or both of the first power transistor 110 and the second power transistor 120 may include a MOSFET (metal oxide semiconductor field effect transistor), a JFET (junction field effect transistor), an IGBT (insulated gate bipolar transistor), or a bipolar transistor, or the like. In accordance with various embodiments, one or both of the first power transistor 110 and the second power transistor 120 may include any other type of power transistor.

In accordance with various embodiments, the first power transistor 110 and the second power transistor 120 may be of the same voltage class. For example, the first power transistor 110 and the second power transistor 120 may have the same voltage rating, i.e. the same or similar maximum voltage that can be sustained by the first power transistor 110 and the second power transistor 120. The first power transistor 110 and the second power transistor 120 may have different current carrying capabilities.

In various embodiments, the first power transistor 110 and the second power transistor 120 are connected in a cascade circuit arrangement, or may be connected in a half bridge circuit arrangement.

In accordance with various embodiments, the control electrode 112 of the first power transistor 110 and the control electrode 122 of the second power transistor 120 may be one of the gate electrode of MOSFET, JFET or IGBT transistors, and the base electrode of bipolar transistors.

Figure 5:
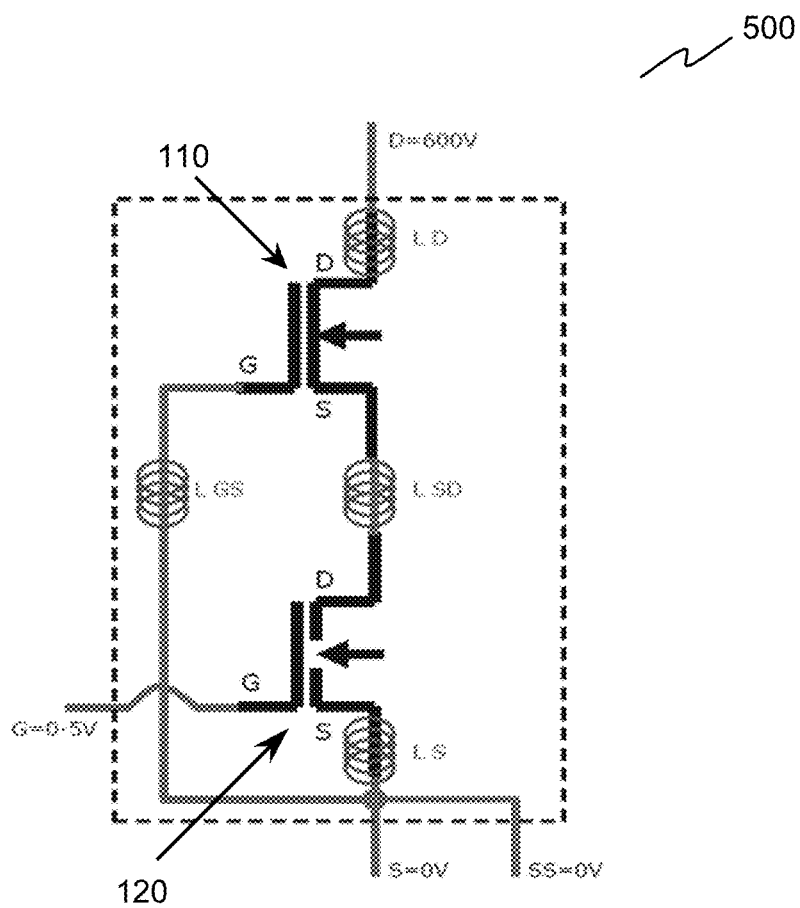
FIG. 5 shows a cascade circuit according to various embodiments.

In accordance with various embodiments, the second power electrode 116 of the first power transistor 110 may be one of the source electrode of a MOSFET or JFET transistor and the emitter electrode of an IGBT or bipolar transistor. The second power electrode 126 of the second power transistor 120 may be one of the drain electrode of a MOSFET or JFET transistor, and the collector electrode of an IGBT or bipolar transistor. The first power transistor 110 and the second power transistor 120, having their respective second power electrode electrically coupled with each other (e.g. through the electrically conductive coupling structure 130), may form a cascode circuit or a half bridge circuit. By way of example, a cascode circuit 500 corresponding to the power arrangement 100 is shown in FIG. 5, as will be described in more detail below. It is understood that the connection between the respective control electrodes and power electrodes of the first power transistor 110 and the second power transistor 120 may be different from the connection shown in FIGS. 1 to 4 to form other types of circuitry, e.g. a half bridge circuit.

In accordance with various embodiments, the first power transistor 110 may be a High Electron Mobility Transistor (HEMT), such as a GaN (Gallium Nitride) HEMT, a SiC (Silicon Carbide) HEMT, or a High-voltage Silicon HEMT. In accordance with various embodiments, the second power transistor 120 may be a low-voltage (e.g., smaller than 500 V, e.g., smaller than 400 V, e.g., smaller than 300 V, e.g., smaller than 200 V) p-channel or n-channel metal oxide semiconductor field effect transistor (MOSFET), such as an SFET (silicon field effect transistor).

In an illustrative embodiment below, the first power transistor 110 is a GaN HEMT and the second power transistor 120 is a SFET. However, it is understood that the first power transistor 110 and the second power transistor 120 may be various types of power transistors described above.

As shown in FIGS. 1 to 4, the power transistor arrangement 100 forms a flipchip-on-lead (FCoL) arrangement. In the FCoL arrangement, the SFET 120 may be re-distributed in a package independently from the GaN HEMT 110, since the gate electrode 122 and the source electrode 124 of the SFET 120 are flipped to respective pins or leads on the carrier 102, and the required contact between the source electrode 124 of the SFET 120 and the gate electrode 112 of the GaN HEMT 110 may be achieved via wire bonding (e.g. through the wire 128) and the second terminal region 108. The SFET 120 may require at least two chip-lead contacts for the gate electrode 122 and the source electrode 124.

As shown in FIG. 3 and FIG. 4, the source electrode 116 of the GaN HEMT 110 may be connected to the drain electrode 126 of the SFET 120 by means of the electrically conductive coupling structure 130 (e.g. a copper clip), to form the node point between the GaN HEMT 110 and the SFET 120 in the cascade circuit 500 of FIG. 5, wherein this node point serves for the internal re-distribution or re-wiring. The connection between the source electrode 116 of the GaN HEMT 110 and the drain electrode 126 of the SFET 120 does not need an external connection or pin or lead, which makes it possible to optimize the electrically conductive coupling structure 130 (e.g. a contact clip) with respect to its thermal performance, e.g. heat capacity and heat spreading, independent from the package contact area (e.g. package footprint).

The FCoL arrangement 100 described above may be formed by at least one flipped chip 120 (i.e. with its control electrode 122 and at least one power electrode 124 facing down towards the carrier 102), and at least one non-flipped chip 110 (i.e. with its control electrode 112 and at least one power electrode 116 facing up away from the carrier 102).

A package may be provided, including the power transistor arrangement 100 of various embodiment above. The package may include package terminals (e.g. pins or leads) configured to receive electrical signals from outside the package. The electrically conductive coupling structure 130 of the power transistor arrangement 100 may be electrically isolated from the package terminals.

In various embodiments, the package may be configured as a through hole package. In various embodiments, the package may be configured as a surface mount device (SMD) package.

In an example, the power transistor arrangement 100 with a flipped SFET and a wire bonded GaN HEMT may be packaged in a 8×8 ThinPAK, wherein the GaN HEMT 110 may be a high voltage (e.g. larger than 200V) HEMT switch and the SFET 120 may be a low voltage (e.g. smaller than 200V) power MOSFET. The GaN HEMT 110 is a normally on device, and is transformed to a normally off transistor with introducing of the low-voltage SFET 120. Such a GaN-SFET arrangement 100 may correspond to the cascade circuit 500 of FIG. 5.

The cascode circuit 500 may include a low voltage SFET 120 in common-source and a high voltage GaN-HEMT 110 in common-gate configuration. The resulting 3-port circuit may act as a switch. The drain electrode of the GaN-HEMT 110 is defining the 600V behavior of the cascade circuit 500.

In the above embodiments, the first power transistor 110 may be non-flipped, such that its control electrode 112 and first power electrode 114 are arranged on the front side of the chip, i.e. facing upward away from the carrier 102. In other embodiments, the first power transistor may be arranged differently, e.g. as illustrated in FIG. 6A and FIG. 6B below.

Figure 6A:
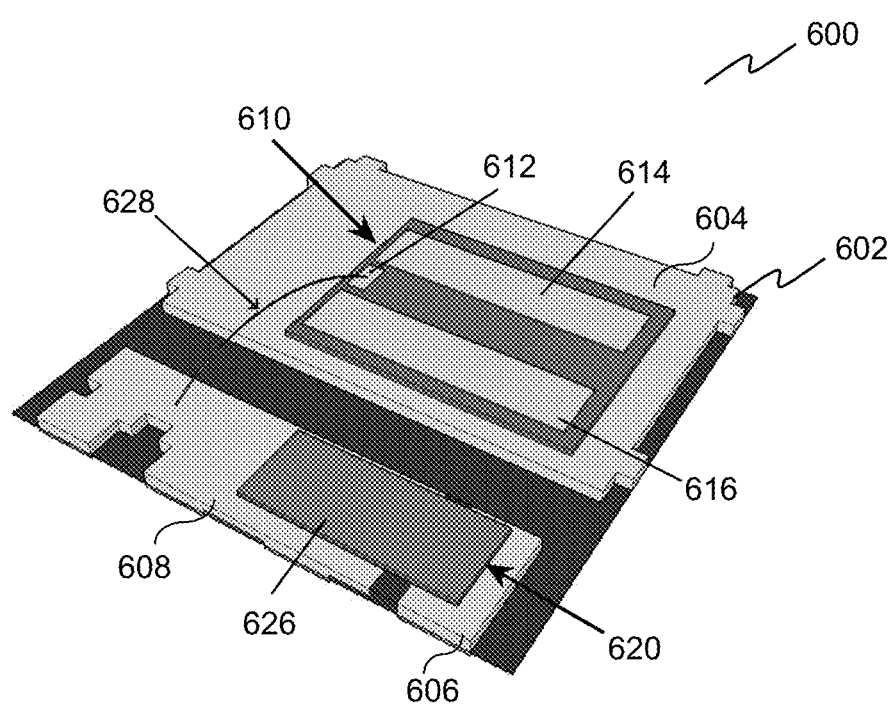
FIGS. 6A and 6B show a power transistor arrangement according to various embodiments.
Figure 6B:
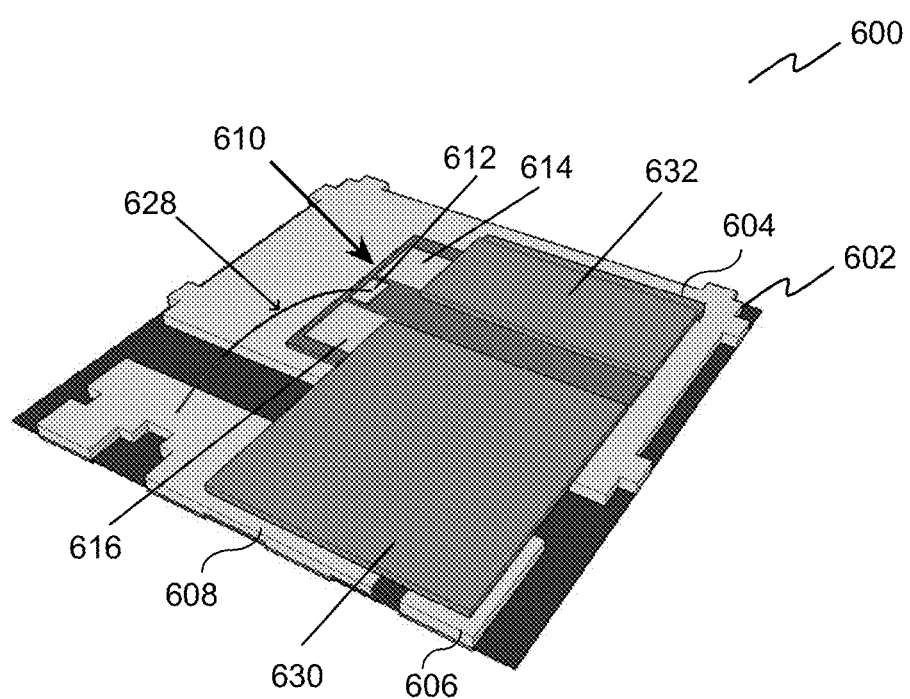

FIG. 6A and FIG. 6B show a power transistor arrangement 600 according to various embodiments.

Similar to the power transistor arrangement 100 in FIG. 1 to FIG. 4 above, the power transistor arrangement 600 in FIG. 6A and FIG. 6B may include a carrier 602, a first power transistor 610, and a second power transistor 620. The carrier 602 may include at least a main region 604, a first terminal region 606 and a second terminal region 608. The main region 604, the first terminal region 606 and the second terminal region 608 may be electrically isolated from each other. The second power transistor 620 may include a control electrode and a first power electrode (not shown) and a second power electrode 626. The second power transistor 620 may be arranged on the first terminal region 606 and the second terminal region 608 such that the control electrode of the second power transistor 620 and the first power electrode of the second power transistor 620 are facing towards the terminal regions 606, 608 of the carrier 602. The control electrode of the second power transistor 620 may be electrically coupled to the first terminal region 606 of the carrier 602, and the first power electrode of the second power transistor 620 may be electrically coupled to the second terminal region 608 of the carrier 602.

Similar to the power transistor arrangement 100 in FIG. 1 to FIG. 4 above, the first power transistor 610 of the power transistor arrangement 600 in FIG. 6A and FIG. 6B may include a control electrode 612, a first power electrode 614 and a second power electrode 616. In various embodiments, the first power transistor 610 may be arranged on the main region 604 of the carrier 602 such that the control electrode 612 of the first power transistor 610 is facing away from the main region 604 of the carrier 602. In various embodiments, the control electrode 612 of the first power transistor 610 may be electrically coupled to one of the first terminal region 606 and the second terminal region 608, for example, to the second terminal region 608 by means of a wire 628, or other suitable types of electrically coupling structure.

Similar to the power transistor arrangement 100 in FIG. 1 to FIG. 4 above, the second power electrode 616 of the first power transistor 610 and the second power electrode 626 of the second power transistor 620 may be electrically coupled with each other, for example, by means of an electrically conductive coupling structure 630 as shown in FIG. 6B. The electrically conductive coupling structure 630 may be arranged above the structure shown in FIG. 6A, i.e., above the second power electrode 616 of the first power transistor 610 and the second power electrode 626 of the second power transistor 620.

However, different from the power transistor arrangement 100, the first power transistor 610 of the power transistor arrangement 600 may be arranged on the main region 604 of the carrier 602 such that the first power electrode 614 of the first power transistor 610 is facing away from the main region 604 of the carrier 602 as shown in FIG. 6A and FIG. 6B. For example, the first power electrode 614 of the first power transistor 610 is at the front side of the first power transistor 610 in FIG. 6A and FIG. 6B. In other words, both the first power electrode 614 and the second power electrode 616 are arranged on the front side of the chip 610.

In the embodiments of FIG. 6A and FIG. 6B, a further re-distribution or re-wiring element may be provided for the first power electrode 614 of the first power transistor 610, which is arranged to face away from the carrier 602. In various embodiment, a further electrically coupling structure 632 is provided to electrically couple the first power electrode 614 of the first power transistor 610 (e.g. a drain electrode of a MOSFET 610) to the main region 604 of the carrier 602.

Except the above difference from the power transistor arrangement 100, various embodiments described with reference to the power transistor arrangement 100 of FIG. 1 to FIG. 5 above are analogously valid for the power transistor arrangement 600 of FIG. 6A and FIG. 6B.

Various embodiments provide a power transistor arrangement. The power transistor arrangement may include a carrier including at least a main region and a first terminal region and a second terminal region, the main region, the first terminal region and the second terminal region being electrically isolated from each other; a first power transistor having a control electrode and a first power electrode and a second power electrode, the first power transistor being arranged on the main region of the carrier such that the first power electrode of the first power transistor is facing towards the main region of the carrier and is electrically coupled to the main region of the carrier; a second power transistor having a control electrode and a first power electrode and a second power electrode, the second power transistor being arranged on the first terminal region and the second terminal region such that the control electrode of the second power transistor and the first power electrode of the second power transistor are facing towards the terminal regions of the carrier. The control electrode of the second power transistor may be electrically coupled to the first terminal region of the carrier, and the first power electrode of the second power transistor may be electrically coupled to the second terminal region of the carrier.

The main region of the carrier may have a size of at least 5 mm$^2$, e.g. a size of at least 6 mm$^2$, e.g. a size of at least 7 mm$^2$, e.g. a size of at least 8 mm$^2$, e.g. a size of at least 9 mm$^2$, e.g. a size of at least 10 mm$^2$. In various embodiments, the main region of the carrier may have a size of less than or equal to 600 mm$^2$, e.g. less than or equal to 500 mm$^2$, e.g. less than or equal to 450 mm$^2$, e.g. less than or equal to 400 mm$^2$, e.g. less than or equal to 350 mm$^2$, e.g. less than or equal to 300 mm$^2$.

In various embodiments, at least one of the first terminal region and the second terminal region of the carrier may have a size of less than or equal to 5 mm$^2$, e.g less than or equal to 4 mm$^2$, e.g less than or equal to 3 mm$^2$, e.g less than or equal to 2 mm$^2$, e.g less than or equal to 1 mm$^2$, e.g less than or equal to 0.5 mm$^2$.

In various embodiments, the first power transistor may be arranged on the main region of the carrier such that the control electrode of the first power transistor is facing away from the main region of the carrier.

In various embodiments, the control electrode of the first power transistor may be electrically coupled to one of the first terminal region and the second terminal region. In various embodiments, the control electrode may be electrically coupled to one of the first terminal region and the second terminal region by means of a wire, or other suitable types of electrically coupling structure.

In various embodiments, the second power electrode of the first power transistor and the second power electrode of the second power transistor may be electrically coupled with each other. In various embodiments, the second power electrode of the first power transistor and the second power electrode of the second power transistor may be electrically coupled with each other by means of an electrically conductive coupling structure.

In various embodiments, the coupling structure may include at least one of a metal and a metal alloy. In various embodiments, the coupling structure may include at least one structure selected from a group of structures consisting of: a clip, a ribbon, a wire, a plate, and a conductor track. In various embodiments, the coupling structure may have a thermal resistance of 1 K/W or less.

The electrically conductive coupling structure may be electrically isolated from any power transistor arrangement external terminals. The power transistor arrangement external terminals may include leads or pins coupled to the carrier, for example.

In accordance with various embodiments, one or both of the first power transistor and the second power transistor may include a MOSFET, a JFET, an IGBT, or a bipolar transistor.

In accordance with various embodiments, the first power transistor may be a High Electron Mobility Transistor (HEMT), such as a GaN (Gallium Nitride) HEMT, a SiC (Silicon Carbide) HEMT, or a High-voltage Silicon HEMT.

In accordance with various embodiments, the second power transistor may be a low-voltage (e.g., smaller than 200V) metal oxide semiconductor field effect transistor (p-channel or n-channel), such as a SFET (silicon field effect transistor).

In various embodiments, the first power transistor and the second power transistor are connected in a cascade circuit arrangement, or may be connected in a half bridge circuit arrangement.

In accordance with various embodiments, the control electrode of the first power transistor and the control electrode of the second power transistor may be one of the gate electrode of MOSFET, JFET or IGBT transistors, and the base electrode of bipolar transistors.

In accordance with various embodiments, the second power electrode of the first power transistor may be one of the source electrode of a MOSFET or JFET transistor and the emitter electrode of an IGBT or bipolar transistor. The second power electrode of the second power transistor may be one of the drain electrode of a MOSFET or JFET transistor, and the collector electrode of an IGBT or bipolar transistor. The first power transistor and the second power transistor, having their respective second power electrode electrically coupled with each other (e.g. through the electrically conductive coupling structure), may form a cascade circuit or a half bridge circuit.

In various embodiments, the carrier may be a leadframe structure, which may be made of a metal or a metal alloy, e.g. a material selected from a group consisting of: copper (Cu), iron nickel (FeNi), steel, and the like. In various embodiment, the main region may be a leadframe. The first terminal region may be a first lead of the leadframe structure. The second terminal region may be a second lead of the leadframe structure.

In an embodiment, the power transistor arrangement may have a size of about 1 mm*1 mm. In a further embodiment, the power transistor arrangement may have a size of about 20 mm*20 mm.

Various embodiments further provides a package including a power transistor arrangement. The power transistor arrangement may include a carrier including at least a main region and a first terminal region and a second terminal region, the main region, the first terminal region and the second terminal region being electrically isolated from each other; a first power transistor having a control electrode and a first power electrode and a second power electrode, the first power transistor being arranged on the main region of the carrier such that the first power electrode of the first power transistor is facing towards the main region of the carrier and is electrically coupled to the main region of the carrier; a second power transistor having a control electrode and a first power electrode and a second power electrode, the second power transistor being arranged on the first terminal region and the second terminal region such that the control electrode of the second power transistor and the first power electrode of the second power transistor are facing towards the terminal regions of the carrier. The control electrode of the second power transistor may be electrically coupled to the first terminal region of the carrier, and the first power electrode of the second power transistor may be electrically coupled to the second terminal region of the carrier.

In various embodiments, the package may be configured as a through hole package. In various embodiments, the package may be configured as a surface mount device (SMD) package.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A power transistor arrangement, comprising:
a carrier comprising at least a main region and a first terminal region and a second terminal region, the main region, the first terminal region and the second terminal region being electrically isolated from each other;
a first power transistor having a control electrode and a first power electrode and a second power electrode, the first power transistor being arranged over the main region of the carrier such that the first power electrode of the first power transistor is facing towards the main region of the carrier and is electrically coupled to the main region of the carrier;
a second power transistor having a control electrode and a first power electrode and a second power electrode,
the second power transistor being arranged over the first terminal region and the second terminal region such that the control electrode of the second power transistor and the first power electrode of the second power transistor are facing towards the terminal regions of the carrier,
wherein the control electrode of the second power transistor is electrically coupled to the first terminal region of the carrier, and wherein the first power electrode of the second power transistor is electrically coupled to the second terminal region of the carrier;
wherein the control electrode of the first power transistor is electrically coupled to one of the first terminal region and the second terminal region; and
wherein the second power electrode of the first power transistor and the second power electrode of the second power transistor are electrically coupled with each other.

2. The power transistor arrangement of claim 1, wherein the main region of the carrier has a size of at least 10 mm$^2$.

3. The power transistor arrangement of claim 2, wherein the main region of the carrier has a size of less than or equal to 300 mm$^2$.

4. The power transistor arrangement of claim 1, wherein at least one of the first terminal region and the second terminal region of the carrier has a size of less than or equal to 1 mm$^2$.

5. The power transistor arrangement of claim 1, wherein the second power transistor is a low-voltage metal oxide semiconductor field effect transistor.

6. The power transistor arrangement of claim 1, wherein the first power transistor is arranged on the main region of the carrier such that the control electrode of the first power transistor is facing away from the main region of the carrier.

7. The power transistor arrangement of claim 1, wherein the control electrode of the first power transistor is electrically coupled to one of the first terminal region and the second terminal region by means of a wire.

8. The power transistor arrangement of claim 1, wherein the first power transistor is a High Electron Mobility Transistor.

9. The power transistor arrangement of claim 8, wherein the High Electron Mobility Transistor is one of a Gallium Nitride High Electron Mobility Transistor, a Silicon Carbide High Electron Mobility Transistor, and a High-voltage Silicon High Electron Mobility Transistor.

10. The power transistor arrangement of claim 1, wherein the second power electrode of the first power transistor and the second power electrode of the second power transistor are electrically coupled with each other by means of an electrically conductive coupling structure.

11. The power transistor arrangement of claim 10, wherein the coupling structure comprises at least one of a metal and a metal alloy.

12. The power transistor arrangement of claim 10, wherein the coupling structure comprises at least one structure selected from a group of structures consisting of:
a clip;
a ribbon;
a wire;
a plate; and
a conductor track.

13. The power transistor arrangement of claim 1, wherein the carrier is a leadframe structure;
wherein the main region is a leadframe;
wherein the first terminal region is a first lead of the leadframe structure; and
wherein the second terminal region is a second lead of the leadframe structure.

14. The power transistor arrangement of claim 1, wherein the first power transistor and the second power transistor are connected in a cascade circuit arrangement.

15. The power transistor arrangement of claim 1, wherein the first power transistor and the second power transistor are connected in a half bridge circuit arrangement.

16. A package, comprising:
a power transistor arrangement, comprising:
a carrier comprising at least a main region and a first terminal region and a second terminal region, the main region, the first terminal region and the second terminal region being electrically isolated from each other;
a first power transistor having a control electrode and a first power electrode and a second power electrode, the first power transistor being arranged over the main region of the carrier such that the first power electrode of the first power transistor is facing towards the main region of the carrier and is electrically coupled to the main region of the carrier;
a second power transistor having a control electrode and a first power electrode and a second power electrode,
the second power transistor being arranged over the first terminal region and the second terminal region such that the control electrode of the second power transistor and the first power electrode of the second power transistor are facing towards the terminal regions of the carrier,
wherein the control electrode of the second power transistor is electrically coupled to the first terminal region of the carrier, and wherein the first power electrode of the second power transistor is electrically coupled to the second terminal region of the carrier;
wherein the control electrode of the first power transistor is electrically coupled to one of the first terminal region and the second terminal region; and
wherein the second power electrode of the first power transistor and the second power electrode of the second power transistor are electrically coupled with each other.

17. The package of claim 16, configured as a through hole package.

18. The package of claim 16, configured as a surface mount device package.

* * * * *